US008873920B2

(12) United States Patent
Wang et al.

(10) Patent No.: US 8,873,920 B2
(45) Date of Patent: Oct. 28, 2014

(54) LIGHT-GUIDING COVER STRUCTURE

(75) Inventors: Bily Wang, Hsinchu (TW); Kuei-Pao Chen, Hsinchu County (TW); Hsin-Cheng Chen, Hsinchu County (TW); Cheng-Chin Chiu, Taoyuan County (TW)

(73) Assignee: Youngtek Electronics Corporation, Hsinchu (TW)

( * ) Notice: Subject to any disclaimer, the term of this patent is extended or adjusted under 35 U.S.C. 154(b) by 213 days.

(21) Appl. No.: 13/425,829

(22) Filed: Mar. 21, 2012

(65) Prior Publication Data

US 2013/0163922 A1 Jun. 27, 2013

(30) Foreign Application Priority Data

Dec. 21, 2011 (TW) .............................. 100224131 U (51) Int. Cl.
*G02B 6/00* (2006.01)

(52) U.S. Cl.
USPC ............ 385/134; 250/491.1; 438/11; 438/14; 438/15; 209/552; 209/571; 209/575; 257/E21.524; 257/292; 257/48; 257/98; 257/99; 324/759.03

(58) Field of Classification Search
CPC .... G02B 6/001; G02B 6/3616; G02B 6/3644; G02B 6/4298; G01R 31/01; G01R 31/2635; G01R 31/2893; G01R 31/2894
USPC ............. 385/134; 250/491.1; 438/14, 11, 15; 209/552, 571, 575; 257/E21.524, 292, 257/48, 98, 99; 324/759.03
See application file for complete search history.

(56) References Cited

U.S. PATENT DOCUMENTS

| 3,176,840 | A | * | 4/1965 | Bickel ........................... 209/573 |
| 3,367,476 | A | * | 2/1968 | Aronstein et al. ............ 198/376 |
| 4,775,640 | A | * | 10/1988 | Chan ............................... 438/16 |
| 4,808,815 | A | * | 2/1989 | Langley ................... 250/227.28 |
| 4,820,975 | A | * | 4/1989 | Diggle ...................... 324/750.22 |
| 4,904,934 | A | * | 2/1990 | Nishihashi et al. ...... 324/750.08 |
| 5,268,635 | A | * | 12/1993 | Bortolini et al. ................ 324/96 |
| 5,381,103 | A | * | 1/1995 | Edmond et al. .......... 324/754.06 |
| 5,550,482 | A | * | 8/1996 | Sano ......................... 324/750.19 |
| 5,568,870 | A | * | 10/1996 | Utech ........................... 209/573 |
| 5,842,579 | A | * | 12/1998 | Garcia et al. .................. 209/573 |
| 6,115,528 | A | * | 9/2000 | Schmucker et al. .......... 385/138 |
| 6,119,255 | A | * | 9/2000 | Akram .......................... 714/724 |

(Continued)

FOREIGN PATENT DOCUMENTS

DE 102007013607 * 9/2008 ............. G01N 21/05
JP 2001045597 A * 2/2001 ............. H04R 23/00

*Primary Examiner* — Peter Radkowski
(74) *Attorney, Agent, or Firm* — Li & Cai Intellectual Property (USA) Office (57) ABSTRACT

A light-guiding cover structure includes a top cover unit and a light-guiding unit. The top cover unit has a plurality of receiving spaces formed therein. The light-guiding unit includes a plurality of light-guiding groups, wherein each light-guiding group includes a plurality of optical fiber cables received in the corresponding receiving space, and each optical fiber cable has two opposite ends exposed from the bottom surface of the top cover unit and respectively facing at least one light-emitting device and at least one light-sensing device that have been disposed under the top cover unit. Therefore, the optical fiber cables received in the corresponding receiving space, thus when the light-guiding cover structure is applied to the LED package chip classification system, the aspect of the LED package chip classification system can be enhanced.

14 Claims, 11 Drawing Sheets

(56) References Cited

U.S. PATENT DOCUMENTS

| | | | |
|---|---|---|---|
| 6,227,345 B1* | 5/2001 | Miyamoto | 198/392 |
| 6,246,251 B1* | 6/2001 | Gallagher | 324/756.02 |
| 6,384,612 B2* | 5/2002 | Freund et al. | 324/754.23 |
| 6,479,777 B2* | 11/2002 | Yamakawa | 209/574 |
| 6,608,494 B1* | 8/2003 | Bruce et al. | 324/762.03 |
| 6,670,820 B2* | 12/2003 | Stokes et al. | 324/762.07 |
| 6,850,081 B1* | 2/2005 | Birdsley et al. | 324/754.23 |
| 6,873,172 B2* | 3/2005 | Cornelius et al. | 324/762.02 |
| 7,017,731 B2* | 3/2006 | Ikeda et al. | 198/464.3 |
| 7,056,000 B2* | 6/2006 | Hussey et al. | 362/555 |
| 7,064,832 B2* | 6/2006 | Rogers | 356/406 |
| 7,262,852 B1* | 8/2007 | Gunn et al. | 356/401 |
| 7,851,721 B2* | 12/2010 | Sze et al. | 209/573 |
| 2001/0013486 A1* | 8/2001 | Yamakawa | 209/574 |
| 2003/0122561 A1* | 7/2003 | Stokes et al. | 324/753 |
| 2003/0161163 A1* | 8/2003 | Hussey et al. | 362/487 |
| 2004/0032247 A1* | 2/2004 | Chen et al. | 324/158.1 |
| 2004/0173732 A1* | 9/2004 | Rogers | 250/226 |
| 2004/0187446 A1* | 9/2004 | Takagi et al. | 53/475 |
| 2005/0010328 A1* | 1/2005 | Ikeda et al. | 700/230 |
| 2009/0045830 A1* | 2/2009 | Newton et al. | 324/758 |
| 2010/0209219 A1* | 8/2010 | Sze et al. | 414/222.02 |
| 2011/0316579 A1* | 12/2011 | Ryu | 324/762.07 |
| 2012/0306527 A1* | 12/2012 | O'Toole et al. | 324/762.07 |

* cited by examiner

LIGHT-GUIDING COVER STRUCTURE

BACKGROUND OF THE INVENTION

1. Field of the Invention

The instant disclosure relates to a top cover structure, and more particularly, to a light-guiding cover structure using a plurality of embedded optical fiber cables.

2. Description of Related Art

In the semiconductor fabricating process, some small particles and defects are unavoidable. As the size of devices shrinks and the integration of circuits increases gradually, those small particles or defects affect the property of the integrated circuits more seriously.

For improving the reliability of semiconductor devices, a plurality of tests is performed continuously to find the root cause of the defects or particles. Then, process parameters can be tuned correspondingly to reduce a presence of defects or particles so as to improve the yield and reliability of the semiconductor fabricating process.

SUMMARY OF THE INVENTION

One aspect of the instant disclosure relates to a light-guiding cover structure using a plurality of embedded optical fiber cables in order to enhance the aspect of the LED package chip classification system.

One of the embodiments of the instant disclosure provides a light-guiding cover structure, comprising: a top cover unit and a light-guiding unit. The top cover unit has a plurality of receiving spaces formed therein. The light-guiding unit includes a plurality of light-guiding groups, wherein each light-guiding group includes a plurality of optical fiber cables received in the corresponding receiving space, and each optical fiber cable has two opposite ends exposed from the bottom surface of the top cover unit and respectively facing at least one light-emitting device and at least one light-sensing device that have been disposed under the top cover unit.

Another one of the embodiments of the instant disclosure provides a light-guiding cover structure, comprising: a top cover unit and a light-guiding unit. The top cover unit has at least one receiving space formed therein. The light-guiding unit includes a plurality of optical fiber cables received in the at least one receiving space, and each optical fiber cable has two opposite ends exposed from the bottom surface of the top cover unit and respectively facing at least one light-emitting device and at least one light-sensing device that have been disposed under the top cover unit.

Therefore, the optical fiber cables received in the corresponding receiving space or in the at least one receiving sapce, thus when the light-guiding cover structure is applied to the LED package chip classification system, the aspect of the LED package chip classification system can be enhanced.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

FIG. 2D(A) shows a lateral, cross-sectional, schematic view of before using the chip test unit to test the LED package chip of the instant disclosure;

FIG. 2D(B) shows a lateral, cross-sectional, schematic view of when the chip test unit used to test the LED package chip of the instant disclosure;

FIG. 2D(C) shows a lateral, cross-sectional, schematic view of after using the chip test unit to test the LED package chip of the instant disclosure;

FIG. 2G(A) shows a lateral, cross-sectional, schematic view of before separating the LED package chip from the first receiving portion or the second receiving portion of the instant disclosure;

FIG. 2G(B) shows a lateral, cross-sectional, schematic view of after separating the LED package chip from the first receiving portion or the second receiving portion of the instant disclosure.

DETAILED DESCRIPTION OF THE PREFERRED EMBODIMENTS

[First Embodiment]

Figure 1A:
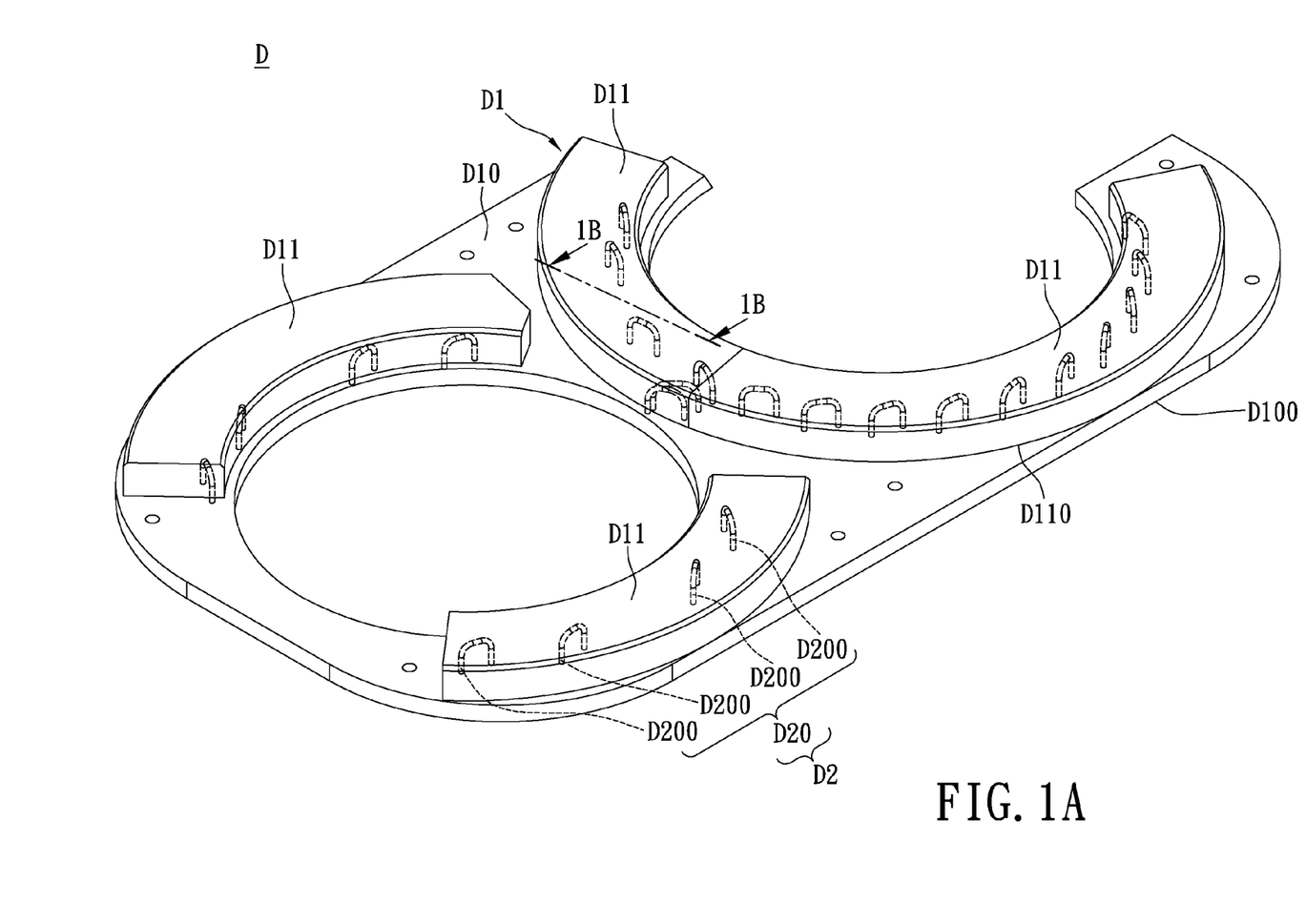
FIG. 1A shows a perspective, schematic view of the light-guiding cover structure of the instant disclosure.
Figure 1B:
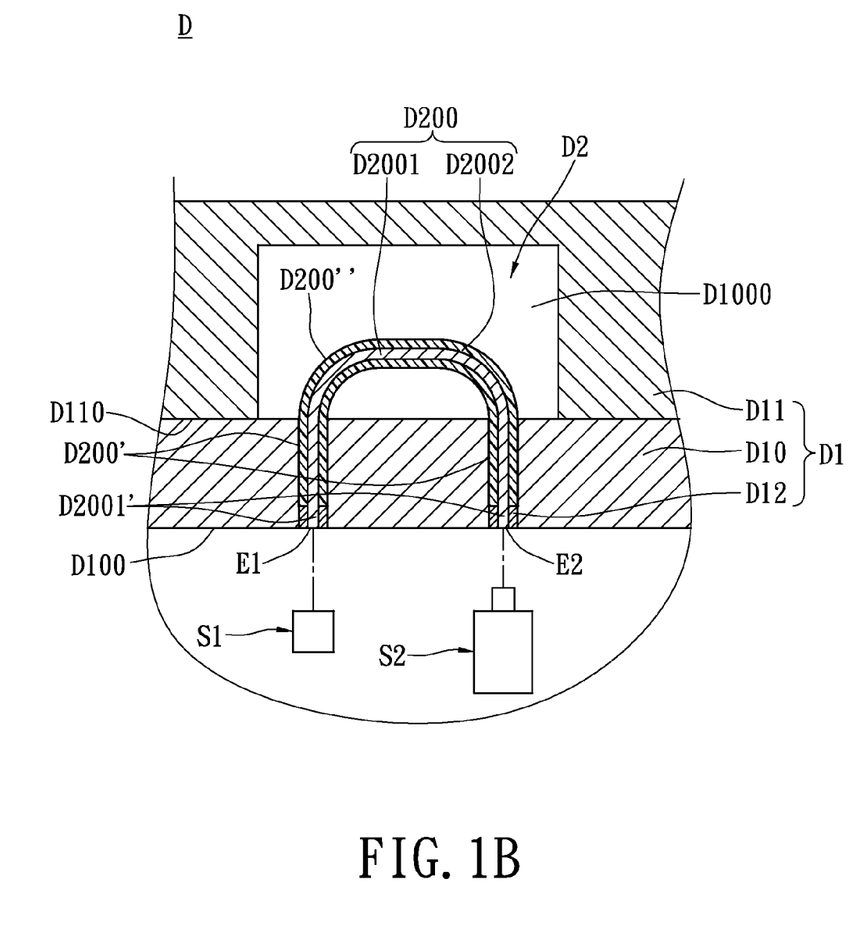
FIG. 1B shows a cross-sectional view taken along the section line 1B-1B of FIG. 1A.
Figure 1C:
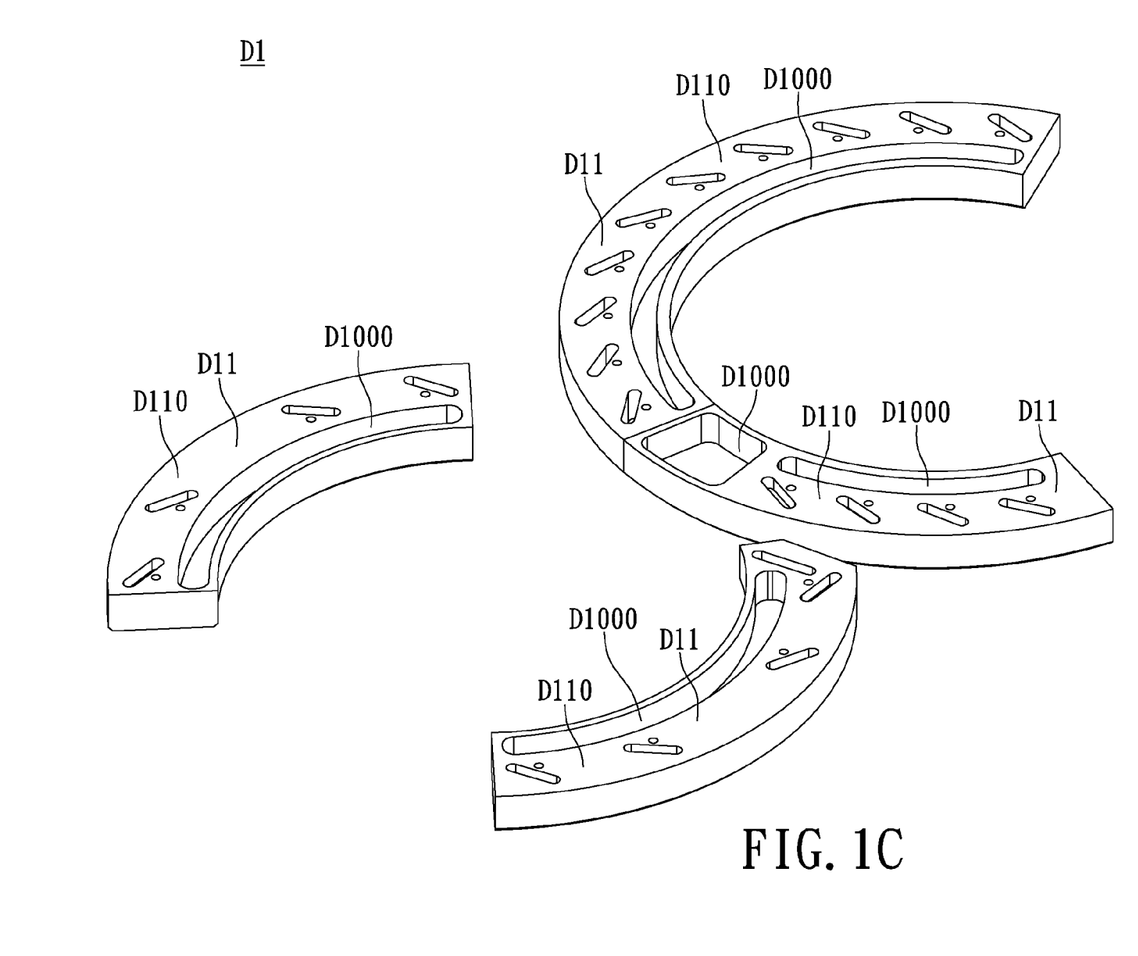
FIG. 1C shows a perspective, schematic view of the top cover unit of the light-guiding cover structure of the instant disclosure.

Referring to FIG. 1A to FIG. 1C, where the instant disclosure provides a light-guiding cover structure D, comprising: a top cover unit D1 and a light-guiding unit D2. The top cover unit D1 has a plurality of receiving spaces D1000 formed therein. The light-guiding unit D2 includes a plurality of light-guiding groups D20. Each light-guiding group D20 includes a plurality of optical fiber cables D200 received in the corresponding receiving space D1000, and each optical fiber cable D200 has two opposite ends (E1, E2) exposed from the bottom surface D100 of the top cover unit D1 and respectively facing at least one light-emitting device Si (such as a LED) and at least one light-sensing device S2 (such as light sensor) that both have been disposed under the top cover unit D1.

For example, the top cover unit D1 includes a base body D10 and a plurality of top covers D11 disposed on the base body D10, and each receiving space D1000 is concaved inwardly from the bottom surface D110 of the corresponding top cover D11 and faces the base body D10, thus each receiving sapce D1000 is enclosed as a closed space between the base body D10 and the top cover D11. Each optical fiber cable D200 can be divided into two end portions D200' embedded into the base body D10 and a middle portion D200" connected between the two end portions D200' and received in the corresponding receiving space D1000. Each optical fiber cable D200 includes at least one optical fiber core D2001 and a protection layer D2002 wrapping around the at least one optical fiber core D2001. The at least one optical fiber core D2001 has two opposite end portions D2001' exposed from the protection layer D2002 and embedded into the base body D10, and the at least one optical fiber core D2001 has two opposite end faces (E1, E2) exposed from the bottom surface D100 of the base body D10 and respectively facing the at least one light-emitting device Si and at least one light-sensing device S2. The two opposite end faces (E1, E2) of the at least one optical fiber core D2001 are substantially flushed with the bottom surface D100 of the base body D10. The top cover unit D1 includes a plurality of fixing elements D12 embedded into the base body D10, and the two opposite end portions D2001' of the at least one fiber corn D2001 are respectively fixed by the two corresponding fixing elements D12.

Of course, in another embodiment, the top cover unit D1 has at least one receiving space D1000 formed therein. The light-guiding unit D2 including a plurality of optical fiber cables D200 received in the at least one receiving space D1000, and the at least one receiving space D1000 is concaved inwardly from the bottom surface D110 of the corresponding top cover D11 and faces the base body D10, thus the at least one receiving space D1000 is enclosed as a closed space between the base body D10 and the top cover D11. Each optical fiber cable D200 is divided into two end portions D200' embedded into the base body D10 and a middle portion D200" connected between the two end portions D200' and received in the at least one receiving space D1000.

Figure 2A:
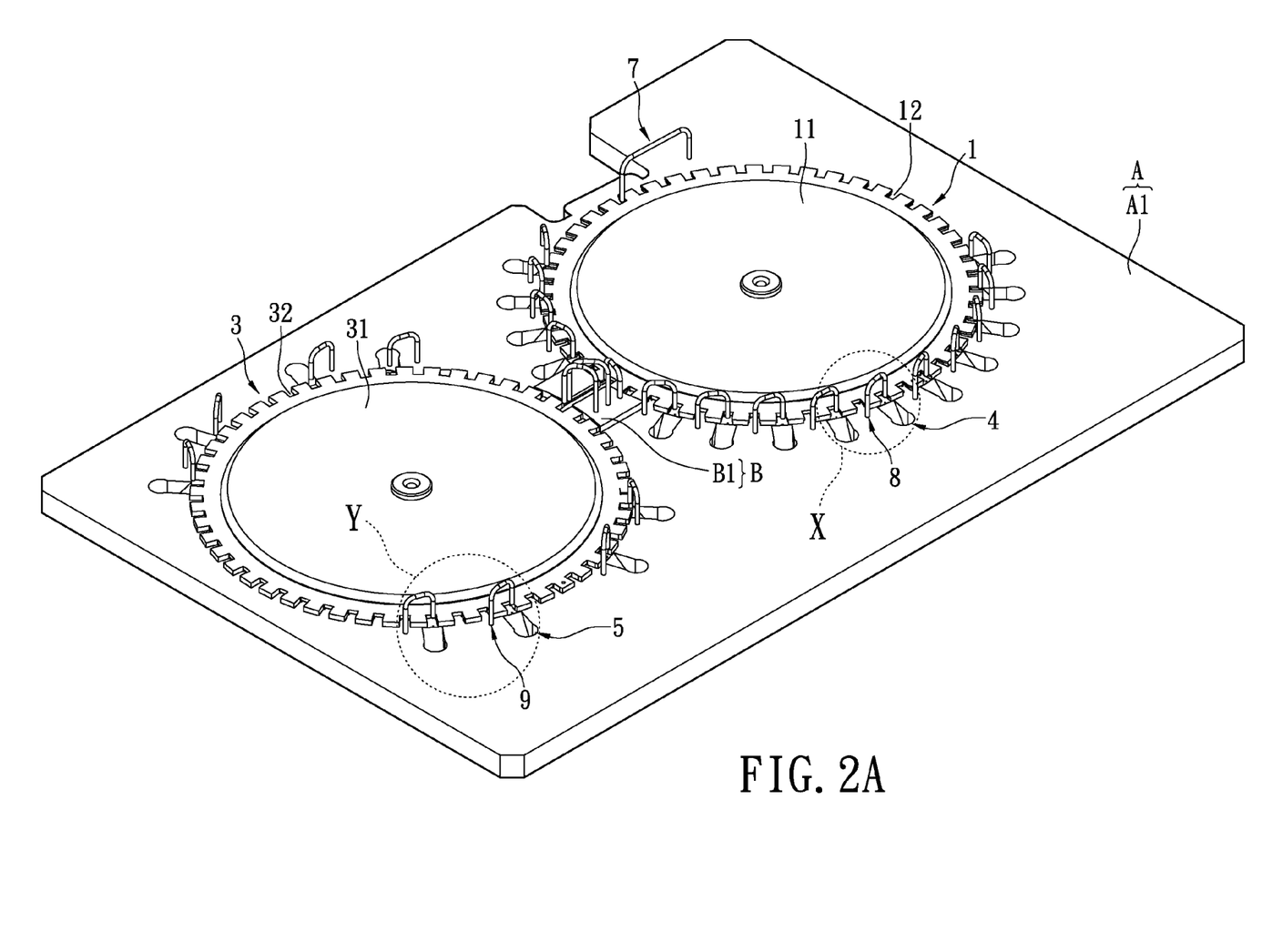
FIG. 2A shows a perspective, schematic view of the LED package chip classification system of the instant disclosure.
Figure 2B:
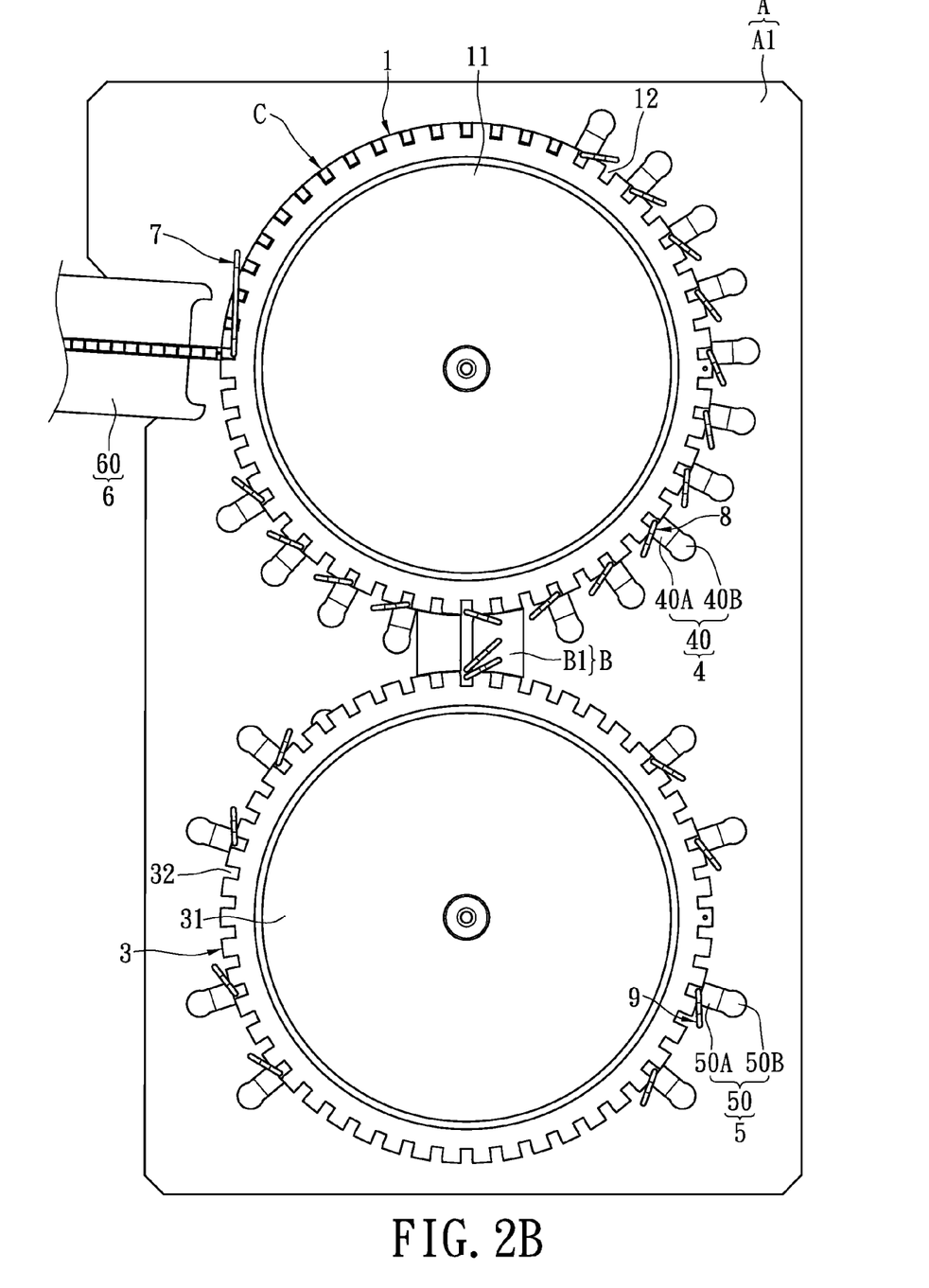
FIG. 2B shows a top, schematic view of the LED package chip classification system of the instant disclosure.
Figure 2C:
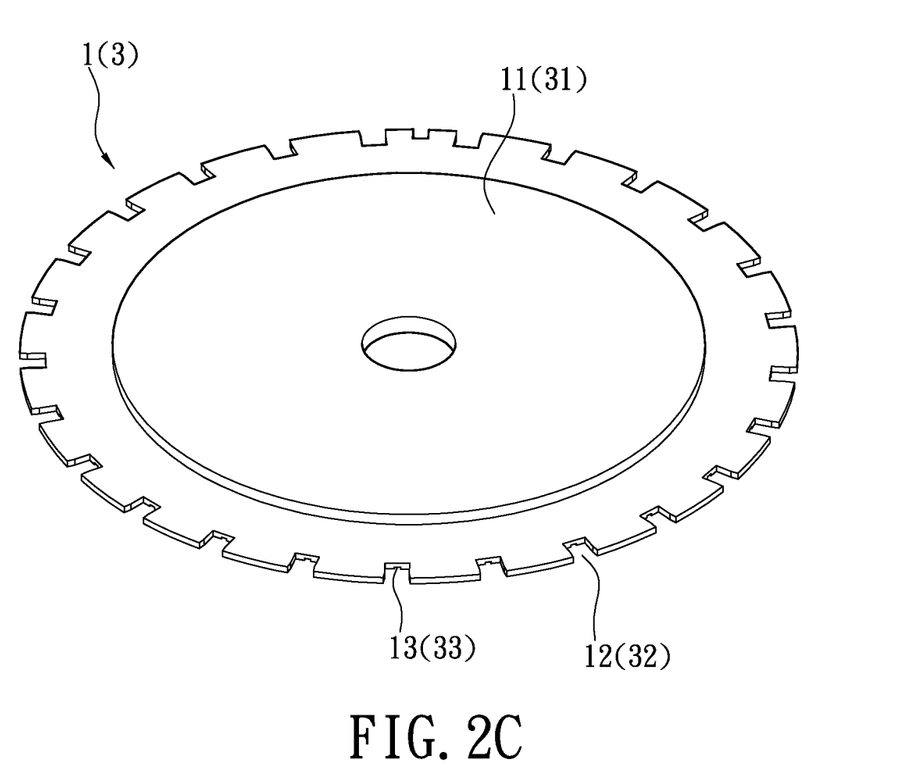
FIG. 2C shows a perspective, schematic view of the first rotation unit or the second rotation unit of the LED package chip classification system of the instant disclosure.
Figure 2D:
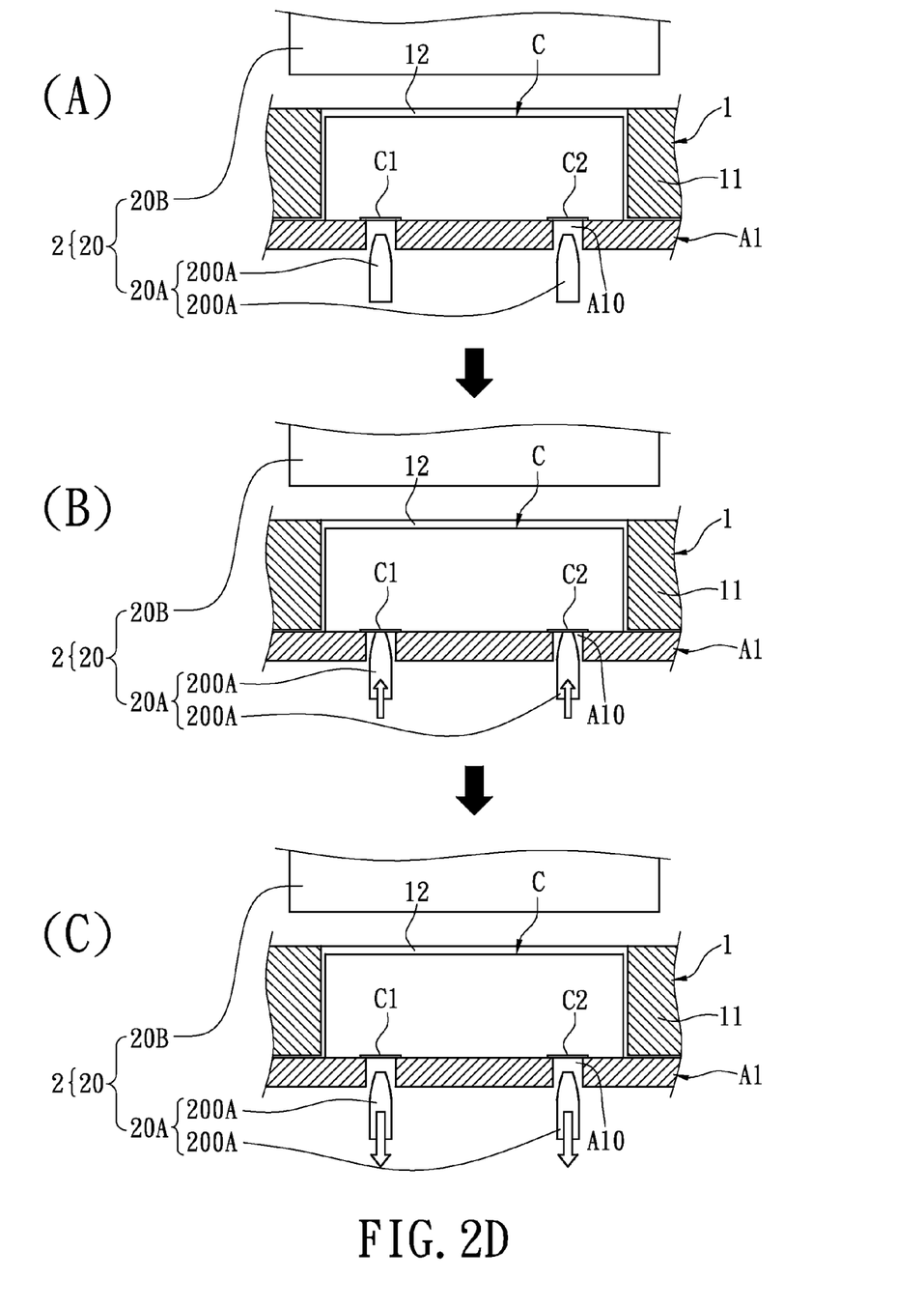
Figure 2E:
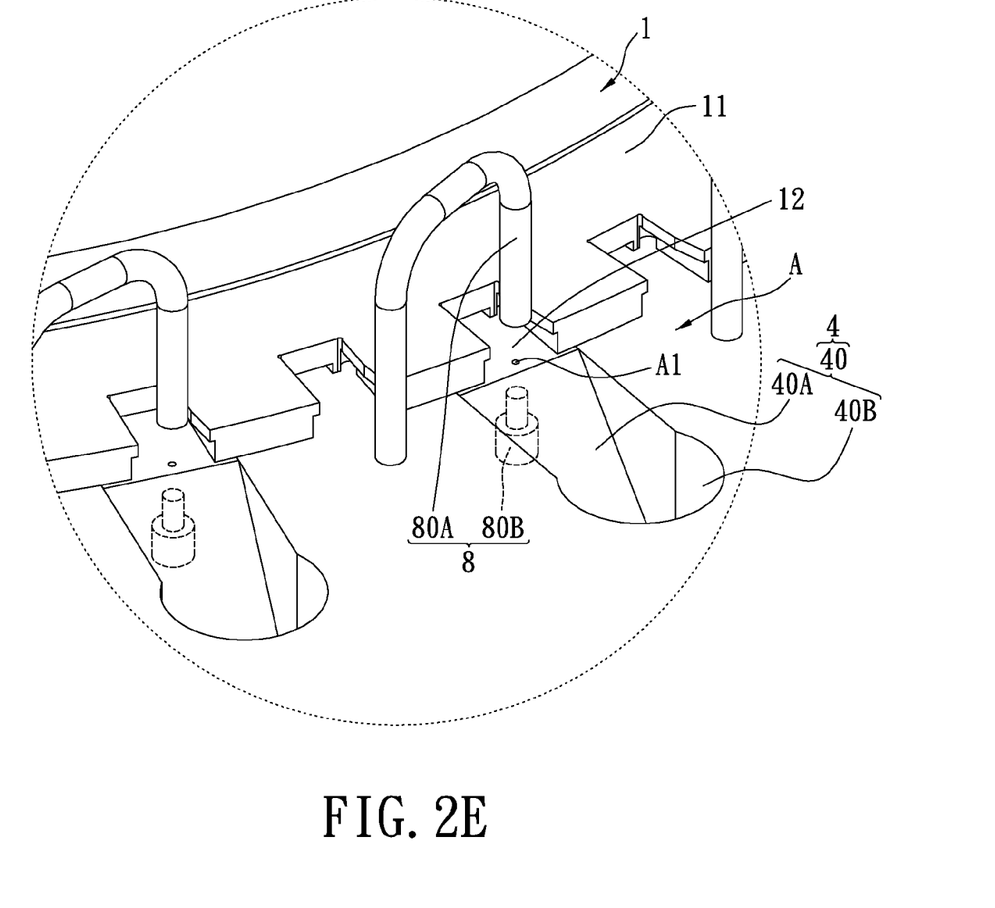
FIG. 2E shows an enlarged view taken on part X of FIG. 2A.
Figure 2F:
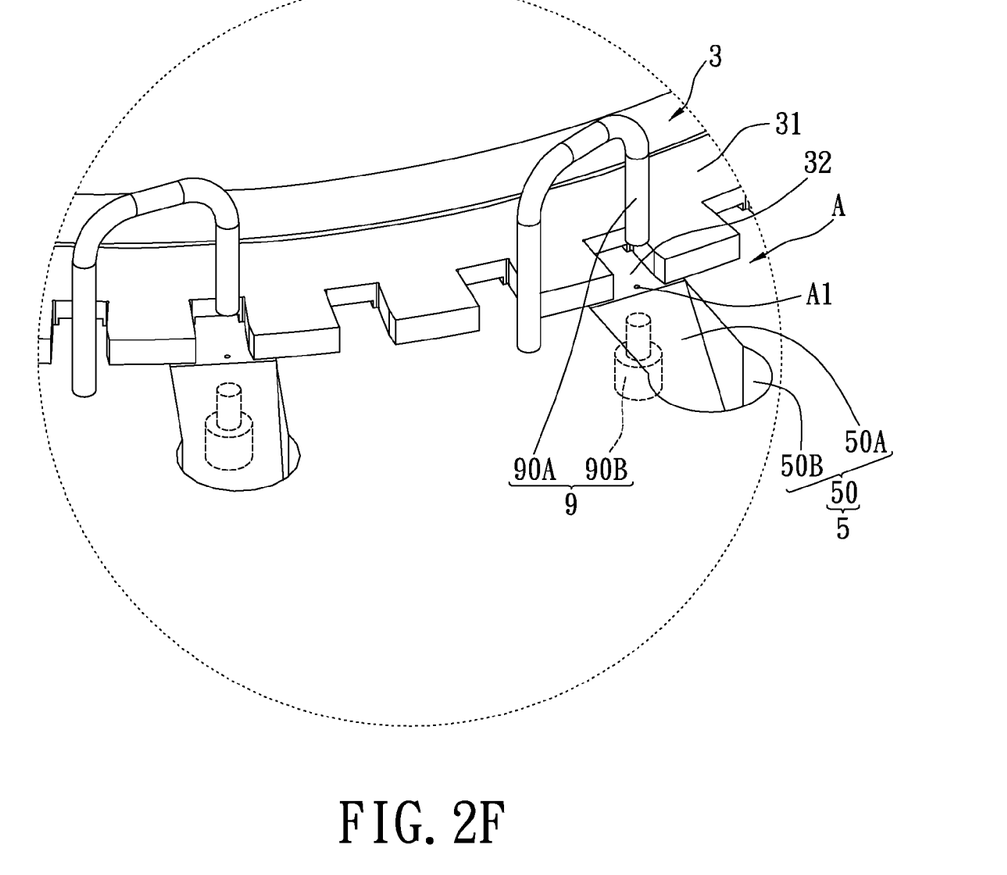
FIG. 2F shows an enlarged view taken on part Y of FIG. 2A.
Figure 2G:
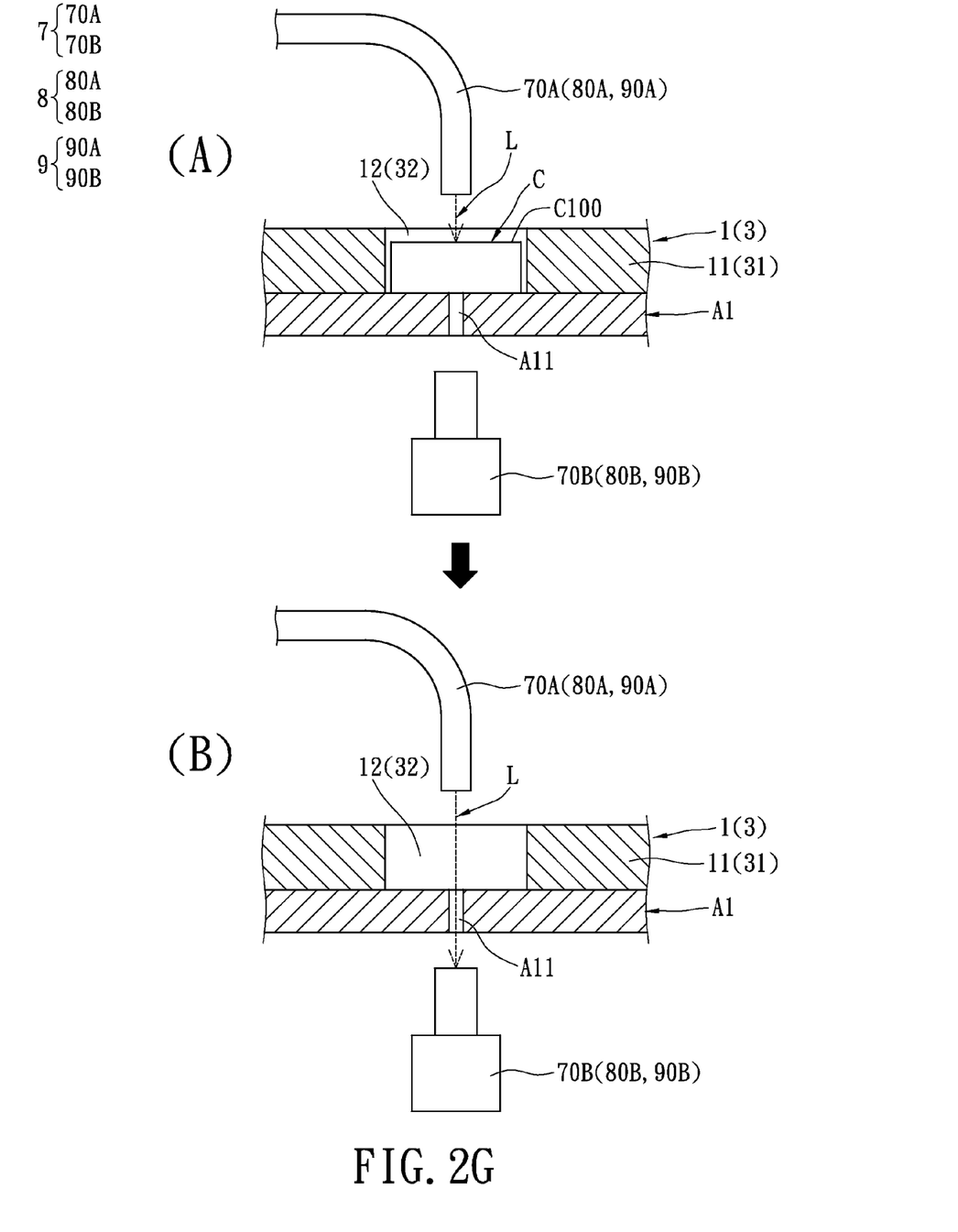
Figure 2H:
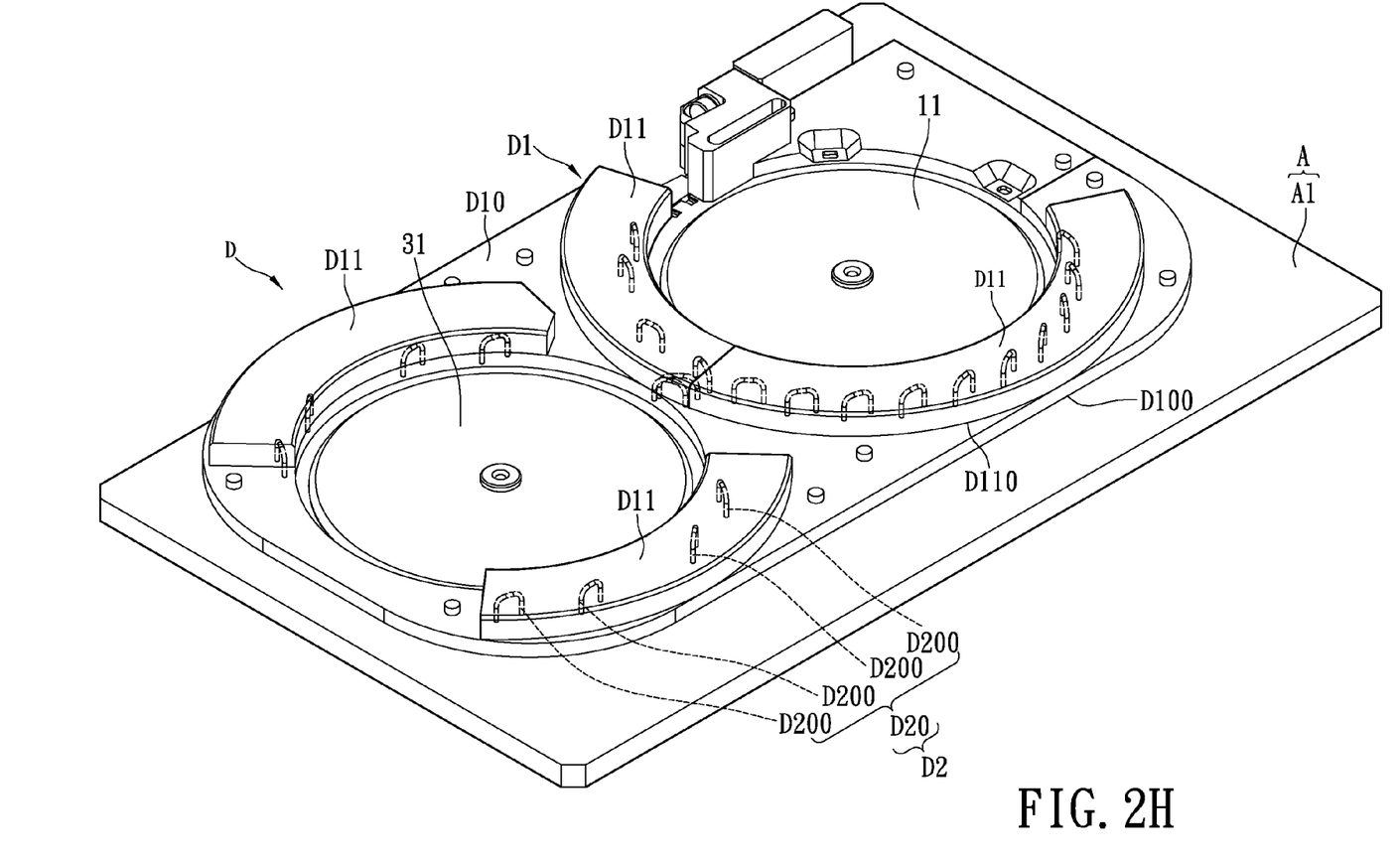
FIG. 2H shows a perspective, schematic view of the LED package chip classification system covered by the protection structure of the instant disclosure.

Referring to FIG. 2A to FIG. 2H, where the top cover unit D1 is removed provisionally in FIG. 2A to FIG. 2G. The light-guiding cover structure D of the instant disclosure can be applied to a LED package chip classification system as shown in FIG. 2H, and the LED package chip classification system comprises a first rotation unit 1 for transporting a plurality of LED package chips C, a chip test unit 2, a second rotation unit 3, a first chip classification unit 4, and a second chip classification unit 5.

Referring to FIGS. 2A, 2B, 2C, and 2D, the first rotation unit 1 includes at least one first rotary turntable 11, a plurality of first receiving portions 12 formed on the first rotary turntable 11, and a plurality of first suction-exhaust dual-purpose openings 13 respectively disposed in the first receiving portions 12. Each first receiving portion 12 can selectively receive at least one of the LED package chips C (as shown in FIG. 2B), and each LED package chip C has a positive electrode pad C1 and a negative electrode pad C2 disposed on the bottom side thereof (as shown in FIG. 2D). For example, the first receiving portions 12 can be arranged as an annular shape. The first receiving portions 12 can be surroundingly formed on the peripheral surface of the at least one first rotary turntable 11 and each first receiving portion 12 has an outward opening, thus each LED packaged chip C can enter the first receiving portion 12 through the outward opening. In addition, the first embodiment of the instant disclosure further comprises a bearing unit A including at least one bearing base A1, and the at least one first rotary turntable 11 is disposed on the at least one bearing base A1.

Referring to FIGS. 2A, 2B, and 2D, the chip test unit 2 includes at least one chip test module 20 adjacent to the first rotation unit 1 for testing each LED package chip C. Nevertheless, a plurality of chip test modules 20 can also be used in the instant disclosure at the same time according to different requirements. In addition, the at least one chip test module 20 includes a power supply element 20A under the LED package chip C to supply power to the LED package chip C and a chip test element 20B disposed above the LED package chip C to test each LED package chip C for obtaining the luminescent property of each LED package chip C. For example, the power supply element 20A may be two conductive pins 200A for providing a positive power source and a negative power source, and the chip test element 20B may be a sensor or an analysis instrument for testing the luminescent property (such as brightness) of each LED package chip C.

The test method of the at least one chip test module 20 is shown in FIG. 2D from (A) to (C). Before using the at least one chip test module 20 to test the LED package chip C as shown in the step (A) of FIG. 2D, the LED package chip C is disposed is received in the corresponding first receiving portion 12 of the first rotation unit 1 and above the power supply element 20A. When the at least one chip test module 20 is used to test the LED package chip C as shown in the step (B) of FIG. 2D, the two conductive pins 200A of the power supply element 20A are moved upwardly (as the direction of the arrow shown in the step (B) of FIG. 2D) at the same time to pass through the openings A10 of the bearing base A1 and the two conductive pins 200A respectively electrically contact the positive electrode pad C1 and the negative electrode pad C2 of the LED package chip C. After using the at least one chip test module 20 to test the LED package chip C as shown in the step (C) of FIG. 2D, the two conductive pins 200A of the power supply element 20A are moved downwardly (as the direction of the arrow shown in the step (C) of FIG. 2D) to go back the original position as shown in the step (A) of FIG. 2D at the same time.

Referring to FIGS. 2A, 2B, and 2C, the shape of the second rotation unit 3 is the same as that of the first rotation unit 1, and the second rotation unit 3 is adjacent to the first rotation unit 1. The second rotation unit 3 includes at least one second rotary turntable 31, a plurality of second receiving portions 32 formed on the second rotary turntable 31, and a plurality of second suction-exhaust dual-purpose openings 33 respectively disposed in the second receiving portions 32. Each second receiving portion 32 can selectively receive at least one of the LED package chips C transmitted from the first rotation unit 1. For example, the second receiving portions 32 can be arranged as an annular shape. The second receiving portions 32 can be surroundingly formed on the peripheral surface of the at least one second rotary turntable 31 and each second receiving portion 32 has an outward opening, thus each LED packaged chip C transmitted from the first rotation unit 1 can enter the second receiving portion 32 through the outward opening. In addition, the first rotary turntable 11 and the second rotary turntable 31 can be disposed on the bearing base A1 at the same time. The bearing base A1 can also be divided into two separated bases (not shown), and the first rotary turntable 11 and the second rotary turntable 31 can be respectively disposed on the two separated bases (not shown).

Referring to FIGS. 2A, 2B, and 2E, the first chip classification unit 4 includes a plurality of first chip classification modules 40 adjacent to the first rotation unit 1 for classifying the LED package chips C that have been tested by the at least one chip test module 20, and the first chip classification modules 40 surround the at least one first rotary turntable 11. In addition, each first chip classification module 40 includes a first passing portion 40A and a first accommodating portion 40B communicated with the first passing portion 40A, and the first passing portion 40A and the first accommodating portion 40B of each first chip classification module 40 are mated with each other to receive the LED package chips C with the same luminescent property. For example, the first passing portion 40A may be a first passing inclined plane communicated with the first receiving portion 12, the first accommodating portion 40B may be a first accommodating opening communicated with the first passing inclined plane, and the first passing inclined plane (the first passing portion 40A) is gradually and downwardly inclined from the first receiving portion 12 to the first accommodating opening (the first accommodating portion 40B).

Referring to FIGS. 2A, 2B, and 2F, the second chip classification unit 5 includes a plurality of second chip classification modules 50 adjacent to the second rotation unit 3 for classifying the LED package chips C that have been tested by the at least one chip test module 20, and the second chip classification modules 50 surround the at least one second rotary turntable 31. In addition, each second chip classification module 50 includes a second passing portion 50A and a second accommodating portion 50B communicated with the second passing portion 50A, and the second passing portion 50A and the second accommodating portion 50B of each second chip classification module 50 are mated with each other to receive the LED package chips C with the same luminescent property. For example, the second passing portion 50A may be a second passing inclined plane communicated with the second receiving portion 32, the second accommodating portion 50B may be a second accommodating opening communicated with the second passing inclined plane, and the second passing inclined plane (the second passing portion 50A) is gradually and downwardly inclined from the second receiving portion 32 to the second accommodating opening (the second accommodating portion 50B).

Referring to FIGS. 2A and 2B, the first embodiment of the instant disclosure further comprises a transportation unit 6 including at least one transportation element 60 adjacent to the first rotary turntable 11 for sequentially transporting each LED package chip C to the corresponding first receiving portion 12.

Referring to FIGS. 2A, 2B, and 2G, the first embodiment of the instant disclosure further comprises a chip position detection unit 7 including a light emitting element 70A (such as the optical fiber cable D200) disposed above the first receiving portion 12 and adjacent to the at least one transportation element 60 and a chip position detection element 70B (such as the light-sensing device S2) disposed under the first receiving portion 12 and corresponding to the light emitting element 70A. In addition, light beams L generated by the light emitting element 70A can be selectively projected onto the top surface C100 of the LED package chip C (as shown in the step (A) of FIG. 2G) or transmitted to the chip position detection element 70B through a through hole A11 penetrating through the at least one bearing base A1 and disposed under the first receiving portion 12 (as shown in the step (B) of FIG. 2G), in order to judge whether the LED package chip C is transmitted from the at least one transportation element 60 to the first receiving portion 12. For example, the first suction-exhaust dual-purpose opening 13 can provide induced air flows to suck the LED package chip C from the at least one transportation element 60 to the first receiving portion 12.

Referring to FIGS. 2A, 2B, 2E, and 2G, the first embodiment of the instant disclosure further comprises a first chip breakaway detection unit 8 including a plurality of first light emitting elements 80A (such as the optical fiber cable D200) respectively disposed above the different first receiving portions 12 and adjacent to the different first chip classification modules 40 and a plurality of first chip breakaway detection elements 80B (such as the light-sensing device S2) respectively disposed under the different first receiving portions 12 and corresponding to the first light emitting elements 80A. In addition, light beams L generated by each first light emitting element 80A can be selectively projected onto the top surface C100 of the LED package chip C (as shown in the step (A) of FIG. 2G) or transmitted to the first chip breakaway detection element 80B through a through hole A11 penetrating through the at least one bearing base A1 and disposed under the first receiving portion 12 (as shown in the step (B) of FIG. 2G), in order to judge whether the LED package chip C is transmitted from the first receiving portion 12 to the first chip classification module 40 or the second receiving portion 32. For example, the first suction-exhaust dual-purpose opening 13 can provide exhaust stream to separate the LED package chip C from the first receiving portion 12.

Referring to FIGS. 2A, 2B, 2F, and 2G, the first embodiment of the instant disclosure further comprises a second chip breakaway detection unit 9 including a plurality of second light emitting elements 90A (such as the optical fiber cable D200) respectively disposed above the different second receiving portions 32 and adjacent to the different second chip classification modules 50 and a plurality of second chip breakaway detection elements 90B (such as the light-sensing device S2) respectively disposed under the different second receiving portions 32 and corresponding to the second light emitting elements 90A. In addition, light beams L generated by each second light emitting element 90A can be selectively projected onto the top surface C100 of the LED package chip C (as shown in the step (A) of FIG. 2G) or transmitted to the second chip breakaway detection element 90B through a through hole A10 penetrating through the at least one bearing base A1 and disposed under the second receiving portion 32 (as shown in the step (B) of FIG. 2G), in order to judge whether the LED package chip C is transmitted from the first receiving portion 12 to the second receiving portion 32 or judge whether the LED package chip C is transmitted from the second receiving portion 32 to the second chip classification module 50. For example, the second suction-exhaust dual-purpose opening 33 can provide exhaust stream to separate the LED package chip C from the second receiving portion 32.

Referring to FIGS. 2A and 2B, the first embodiment of the instant disclosure further comprises a bridge connection unit B including at least one bridge connection element B1 disposed between the first rotation unit 1 and the second rotation unit 3, and each LED package chip C can be transmitted from the first receiving portion 12 to the second receiving portion 32 through the at least one bridge connection element B1.

In conclusion, the optical fiber cables received in the corresponding receiving space or in the at least one receiving sapce, thus when the light-guiding cover structure is applied to the LED package chip classification system, the aspect of the LED package chip classification system can be enhanced.

The above-mentioned descriptions merely represent the preferred embodiments of the instant disclosure, without any intention or ability to limit the scope of the instant disclosure which is fully described only within the following claims Various equivalent changes, alterations or modifications based on the claims of instant disclosure are all, consequently, viewed as being embraced by the scope of the instant disclosure.

What is claimed is:
1. A light-guiding cover structure, comprising:
a top cover unit having a plurality of receiving spaces formed therein; and
a light-guiding unit including a plurality of light-guiding groups,wherein each light-guiding group includes a plurality of optical, fiber cables received in the corresponding receiving space, each optical fiber cable has an input end and an output end opposite to the input end, and the input end and the output end of each optical fiber cable are exposed from the bottom surface of the top cover unit and respectively corresponding to at least one light- emitting device and at least one light-sensing device that have been disposed under the top cover unit;

wherein a chip is disposed between the output end of the optical fiber cable and the at least one light-sensing device, and light beams generated by the at least one light-emitting device pass through the optical fiber cable and project onto the top surface of the chip.

2. The light-guiding cover structure of claim 1, wherein the top cover unit includes a base body and a plurality of top covers disposed on the base body, and each receiving space is concaved inwardly from the bottom surface of the corresponding top cover and faces the base body.

3. The light-guiding cover structure of claim 2, wherein each optical fiber cable is divided into two end portions embedded into the base body and a middle portion connected between the two end portions and received in the corresponding receiving space.

4. The light-guiding cover structure of claim 3, wherein each optical fiber cable includes at least one optical fiber core and a protection layer wrapping around the at least one optical fiber core, the at least one optical fiber core has two opposite end portions exposed from the protection layer and embedded into the base body, and the at least one optical fiber core has two opposite end faces exposed from the bottom surface of the base body and respectively corresponding to the at least one light-emitting device and the at least one light-sensing device.

5. The light-guiding cover structure of claim 4, wherein the two opposite end faces of the at least one optical fiber core are substantially flushed with the bottom surface of the base body.

6. The light-guiding cover structure of claim 4, wherein the top cover unit includes a plurality of fixing elements embedded into the base body, and the two opposite end portions of the at least one fiber corn are respectively fixed by the two corresponding fixing elements.

7. A light-guiding cover structure, comprising:

a top cover unit having at least one receiving space formed therein; and a light-guiding unit including a plurality of optical fiber cables received in the at least one receiving space, wherein each optical fiber cable has an input end and an output end opposite to the input end, and the input end and the output end of each optical fiber cable are exposed from the bottom surface of the top cover unit and respectively corresponding to at least one light-emitting device and at least one light-sensing device that have been disposed under the top cover unit;

wherein a chip is disposed between the output end of the optical fiber cable and the at least one light-sensing device,and light beams generated by the at least one light-emitting device pass through the optical fiber cable and project onto the top surface of the chip.

8. The light-guiding cover structure of claim 7, wherein the top cover unit includes a base body and a plurality of top covers disposed on the base body, and the at least one receiving space is concaved inwardly from the bottom surface of the corresponding top cover and faces the base body.

9. The light-guiding cover structure of claim 8, wherein each optical fiber cable is divided into two end portions embedded into the base body and a middle portion connected between the two end portions and received in the at least one receiving space.

10. The light-guiding cover structure of claim 9, wherein each optical fiber cable includes at least one optical fiber core and a protection layer wrapping around the at least one optical fiber core, the at least one optical fiber core has two opposite end portions exposed from the protection layer and embedded into the base body, and the at least one optical fiber core has two opposite end faces exposed from the bottom surface of the base body and respectively corresponding to the at least one light-emitting device and the at least one light-sensing device.

11. The light-guiding cover structure of claim 10, wherein the two opposite end faces of the at least one optical fiber core are substantially flushed with the bottom surface of the base body.

12. The light-guiding cover structure of claim 10, wherein the top cover unit includes a plurality of fixing elements embedded into the base body, and the two opposite end portions of the at least one fiber corn are respectively fixed by the two corresponding fixing elements.

13. A light-guiding cover structure, comprising:

a top cover unit; and at least one optical fiber cable disposed inside the top cover unit, wherein the at least one optical fiber cable has an input end and an output end opposite to the input end, and the input end and the output end of the at least one optical fiber cable are exposed from the bottom surface of the top cover unit and respectively corresponding to a LED and a light sensor;

wherein when a chip is disposed between the output end of the at least one optical fiber cable and the light sensor, and light beams generated by the LED pass through the at least one optical fiber cable and project onto the top surface of the chip.

14. The light-guiding cover structure of claim 13, wherein the light-guiding cover structure is applied to a LED package chip classification system comprising a first rotation unit, a chip test unit, a second rotation unit, a first chip classification unit and a second chip classification unit;

wherein the first rotation unit includes at least one first rotary turntable, a plurality of first receiving portions formed on the first rotary turntable, and a plurality of first suction-exhaust dual-purpose openings respectively disposed in the first receiving portions;

wherein the chip test unit includes at least one chip test module adjacent to the first rotation unit;

wherein the second rotation unit adjacent to the first rotation unit, and the second rotation unit includes at least one second rotary turntable, a plurality of second receiving portions formed on the second rotary turntable, and a plurality of second suction-exhaust dual-purpose openings respectively disposed in the second receiving portions;

wherein the first chip classification unit includes a plurality of first chip classification modules adjacent to the first rotation unit, and the first chip classification modules surround the at least one first rotary turntable;

wherein the second chip classification unit includes a plurality of second chip classification modules adjacent to the second rotation unit, and the second chip classification modules surround the at least one second rotary turntable.

* * * * *